US006946907B2

(12) United States Patent
Tai

(10) Patent No.: US 6,946,907 B2
(45) Date of Patent: Sep. 20, 2005

(54) COMMON MODE FEEDBACK AMPLIFIER

(75) Inventor: Jy-Der David Tai, Phoenix, AZ (US)

(73) Assignee: Tai-1 Microelectronics Corp., Sanchung (TW)

( * ) Notice: Subject to any disclaimer, the term of this patent is extended or adjusted under 35 U.S.C. 154(b) by 0 days.

(21) Appl. No.: 10/693,096

(22) Filed: Oct. 23, 2003

(65) Prior Publication Data

US 2005/0088228 A1 Apr. 28, 2005

(51) Int. Cl.[7] .................................................. H03F 3/45
(52) U.S. Cl. ........................................ 330/69; 330/258
(58) Field of Search ............................ 330/69, 98, 99, 330/124 R, 258, 259

(56) References Cited

U.S. PATENT DOCUMENTS 5,166,635 A * 11/1992 Shih .......................... 330/253
5,729,178 A 3/1998 Park et al. .................. 330/258
6,448,848 B1 9/2002 Altmann ..................... 327/563
6,639,460 B1 * 10/2003 Botker .......................... 330/9

* cited by examiner

*Primary Examiner*—Steven J. Mottola
(74) *Attorney, Agent, or Firm*—Charles E. Baxley

(57) ABSTRACT

A common mode feedback circuit includes a common mode feedback amplifier unit having output signals and a reference signal, and a combining circuit for combining or adjusting the output signals of the common mode feedback amplifier unit, to prevent the output signals from being distorted, and to maintain the output signals of the common mode feedback amplifier unit at the reference signal. The common mode feedback amplifier unit includes a differential amplifier having two differential input terminals and two differential output terminals. The combining circuit includes two sets of gain amplifier to receive and combine the output signals from the common mode feedback circuit and outputs two differential signals.

4 Claims, 3 Drawing Sheets

COMMON MODE FEEDBACK AMPLIFIER

BACKGROUND OF THE INVENTION

1. Field of the Invention

The present invention relates to a common mode feedback amplifier circuit and method, and more particularly to a common mode feedback amplifier circuit for reduction of signal distortion.

2. Description of the Prior Art

For the requirements of the typical common mode feedback (CMFB) amplifiers, the direct current (DC) voltage level of the output signal is required to be maintained at the same level as the reference voltage, and is to be prevented from being influenced by the DC voltage level of the differential input signals.

Normally, a detecting circuit is included in the CMFB amplifier, in order to detect and correct the DC voltage level of the differential output signals of the CMFB amplifier. When the DC voltage level of the two output signals is different from the reference voltage, the detecting circuit will suitably correct the DC voltage level of the output signals of the CMFB amplifier, until the DC voltage level of the output signals is adjusted to the reference voltage.

However, every detecting circuit of the CMFB amplifier may have its own working limit. Accordingly, once the DC voltage level of the output signals is far deviated from the reference voltage, the detecting circuit may not be able to suitably correct or adjust the DC voltage level of the output signals of the CMFB differential amplifier back to the reference voltage.

When the CMFB amplifiers are working or operating for large signals, deviation of the DC voltage of the differential outputs becomes worse. As such the DC voltage may drift to a higher value or a lower value. In either case the output signals may be distorted accordingly, such that the operating range of the output signals will be limited, and such that the operating range of the input signals will also be limited.

In order to prevent the distortion of the output voltage signals, U.S. Pat. No. 5,729,178 to Park et al. provides a fully differential cascode operational amplifier (OP AMP) having an adaptive biasing circuit to eliminate the effect of slew rate. The amplifier has two outputs V1 and V2 compared with a reference voltage VCMREF. However, when V1=V2 and when V1 and V2 are much greater than the reference voltage, the signals may not be suitably adjusted back to the reference voltage.

The working range may have been improved by Park et al., however, the DC voltage level of the output signals may still be greatly deviated from the reference voltage under certain circumstances.

U.S. Pat. No. 6,448,848 to Altmann discloses a differential transconductor-capacitor (gm-C) circuit employing two transistors to calibrate or adjust the output signals. The control signals are coming from the voltages of a detecting circuit. However, in the detecting circuit, the common mode reference voltage is not compared directly with the input signals, instead it is compared with the intermediate signals, such that the output signals “out and outB” may not be accurately controlled.

When the two output signals “out and outB” may not be completely symmetric to each other, due to the manufacturing procedures of the semiconductor process, the voltage difference may not be suitably improved by the detecting circuit. The detecting circuit may only be used to improve the average voltage of the two output signals, such that the two output signals “out and outB” may have different DC voltage levels, and such that the signal distortions may occur for the large signals.

The present invention is to mitigate and/or obviate the afore-described disadvantages of the conventional common mode feedback amplifier.

SUMMARY OF THE INVENTION

The primary objective of the present invention is to provide a common mode feedback amplifier including an improving circuit or structure to maintain the DC voltage of the output signals at the reference level, and to prevent the output signals from being distorted.

In accordance with one aspect of the invention, there is provided a method for improving a common mode feedback amplifier, the method comprising mixing signals of the common mode feedback amplifier, to increase working range of the common mode feedback amplifier, and to prevent output signals of the common mode feedback amplifier from being seriously distorted due to operating limit of the common mode feedback amplifier.

In accordance with another aspect of the invention, there is provided a common mode feedback amplifier comprising a common mode feedback amplifier unit including two input signals as differential input signals; i.e., the input signals are equal but reverse to each other, the two output signals are also differential output signals. The common mode feedback amplifier may not suitably adjust the DC voltage of the two differential output signals, in which the common mode feedback amplifier includes a symmetric circuit, such that the DC voltage of the two differential output signals may deviate toward the same direction, such that the two differential output signals may be distorted when large output signals are generated or output.

In order to improve the problem, the common mode feedback amplifier in accordance with the present invention is to provide two sets of symmetric gain amplifiers coupled to the two output terminals for the two differential output signals from the common mode feedback amplifier, in order to improve the signal distortion problem when the DC voltage of the two differential output signals from the common mode feedback amplifier is deviated toward the same direction to cause large output signals to be distorted.

When the DC voltage of the differential output signals of the CMFB amplifier is deviated to one direction and the differential output signals are distorted and are input to the gain amplifiers, these two differential signals are coupled to the positive and the negative input terminals of a gain amplifier, such that these two deviated and distorted differential signals will be combined or mixed in phase by the amplifiers, and such that the distorted portions of the signals will be complementary with each other, in order to decrease the distortion thereof.

The other gain amplifier is identical to the previous gain amplifier, but has two differential input signals arranged in opposite order, such that the output signal of the other gain amplifier will be differential relative to the output signal of the previous gain amplifier, such that the two gain amplifiers may provide improved differential output signals that have low distortion.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
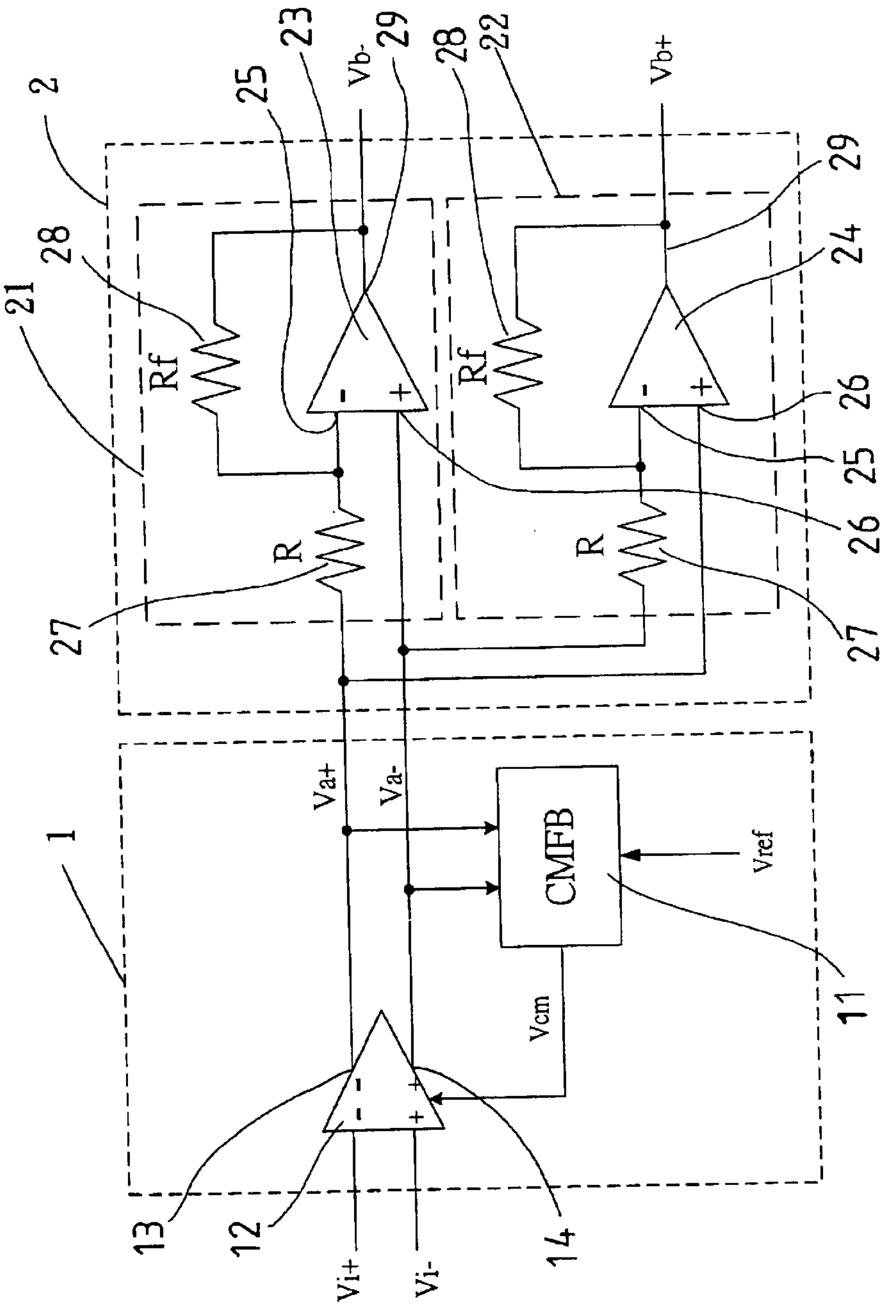
FIG. 1 is a plan schematic view illustrating a circuit of a common mode feedback amplifier in accordance with the present invention.

Referring to the drawings, and initially to FIG. 1, a common mode feedback amplifier in accordance with the present invention comprises a common mode feedback amplifier unit 1 for amplifying and detecting the difference between DC voltage of the output signals and a reference voltage, and calibrating or adjusting the DC voltage to the reference voltage, a differential adjusting unit 2 of symmetric gain amplifiers for cancellation of distorted part of the differential signals.

The common mode feedback amplifier unit 1 includes a common mode feedback circuit (CMFB) 11, and a differential amplifier 12 having two differential input signals Vi+ and Vi−, and having two output terminals 13, 14 coupled to the CMFB 11, for transmitting output signals Va+ and Va− to the CMFB 11. The CMFB 11 includes a reference signal Vref input thereto, and includes a feedback or control signal Vcm output to the differential amplifier 12, in order to generate a feedback signal to control the DC voltage of the output signals Va+ and Va− of the differential amplifier 12.

The differential adjusting unit 2 includes two sets of gain amplifiers 21, 22 each having an amplifier 23, 24 respectively. The amplifiers 23, 24 each includes a negative input terminal 25 coupled to the output terminals 13, 14 of the differential amplifier 12 via a resistor 27 respectively, and a positive input terminal 26 coupled to the other output terminals 14, 13 of the differential amplifier 12 respectively.

The gain amplifiers 21, 22 of the differential adjusting unit 2 each may further include a feedback resistor Rf 28 coupled between the negative input terminal 25 and an output terminal 29 of the amplifiers 23, 24 respectively for gain control. The differential adjusting unit 2 may receive and mix or blend the output signals Va+ and Va− of the differential amplifier 12, and may complement the distorted part of the signals with each other and may generate output signals Vb+ and Vb−, to prevent the output signals Vb+ and Vb− from being distorted.

In operation, the CMFB 11 is coupled to the output terminals 13, 14 of the differential amplifier 12, to receive the output signals Va+ and Va− from the differential amplifier 12, and to check or detect the difference between the DC voltage of the output signals Va+ and Va− of the differential amplifier 12 and the reference signal Vref. The CMFB 11 may then correct or adjust the feedback or control signal Vcm, to actuate or to correct or to adjust the DC voltage at the output terminals 13, 14 of the differential amplifier 12, until the DC voltage of the output signals Va+ and Va− of the differential amplifier 12 equals to the reference signal Vref of the CMFB 11.

Figure 2:
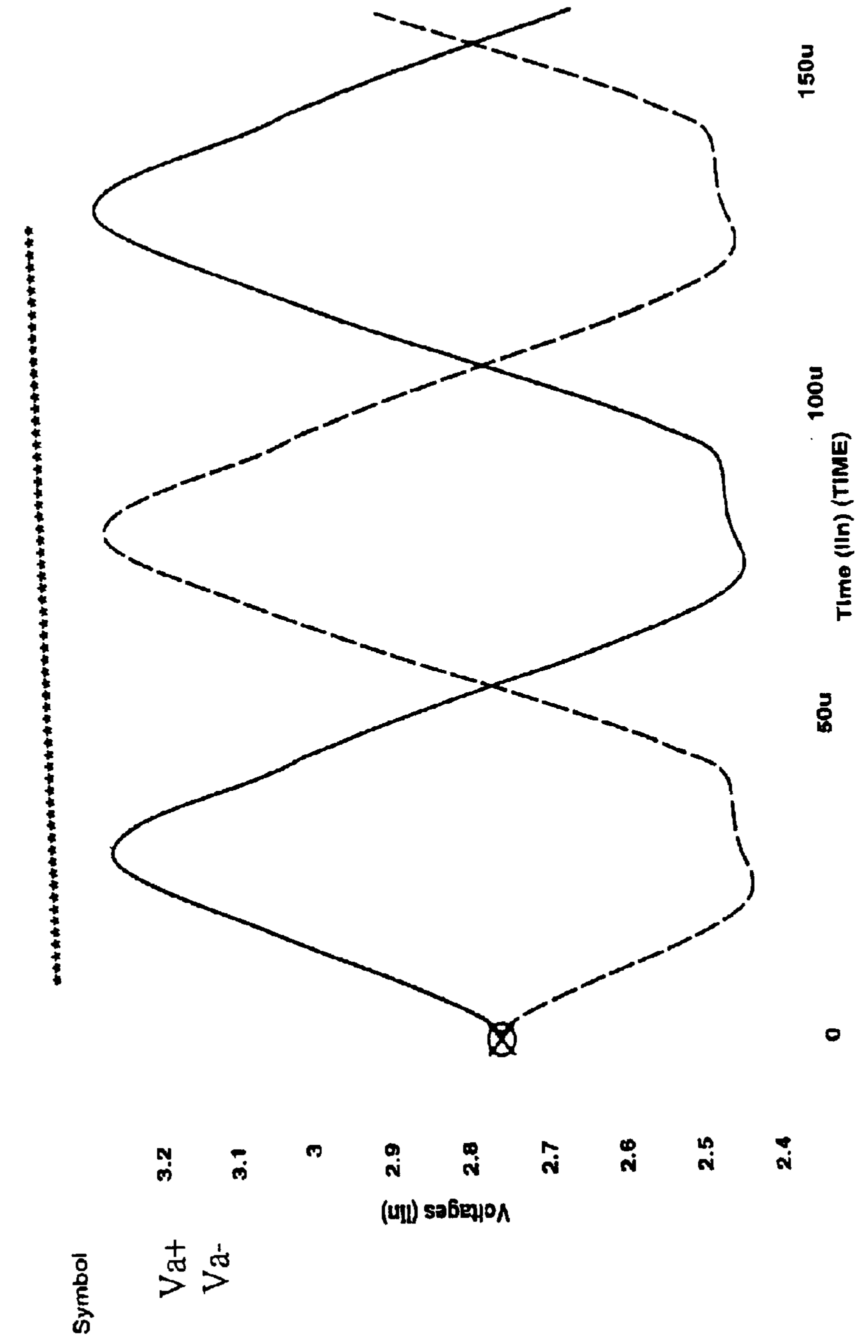
FIG. 2 is a plan schematic view illustrating the waveforms of the common mode feedback amplifier having no gain amplifiers included therein.
Figure 3:
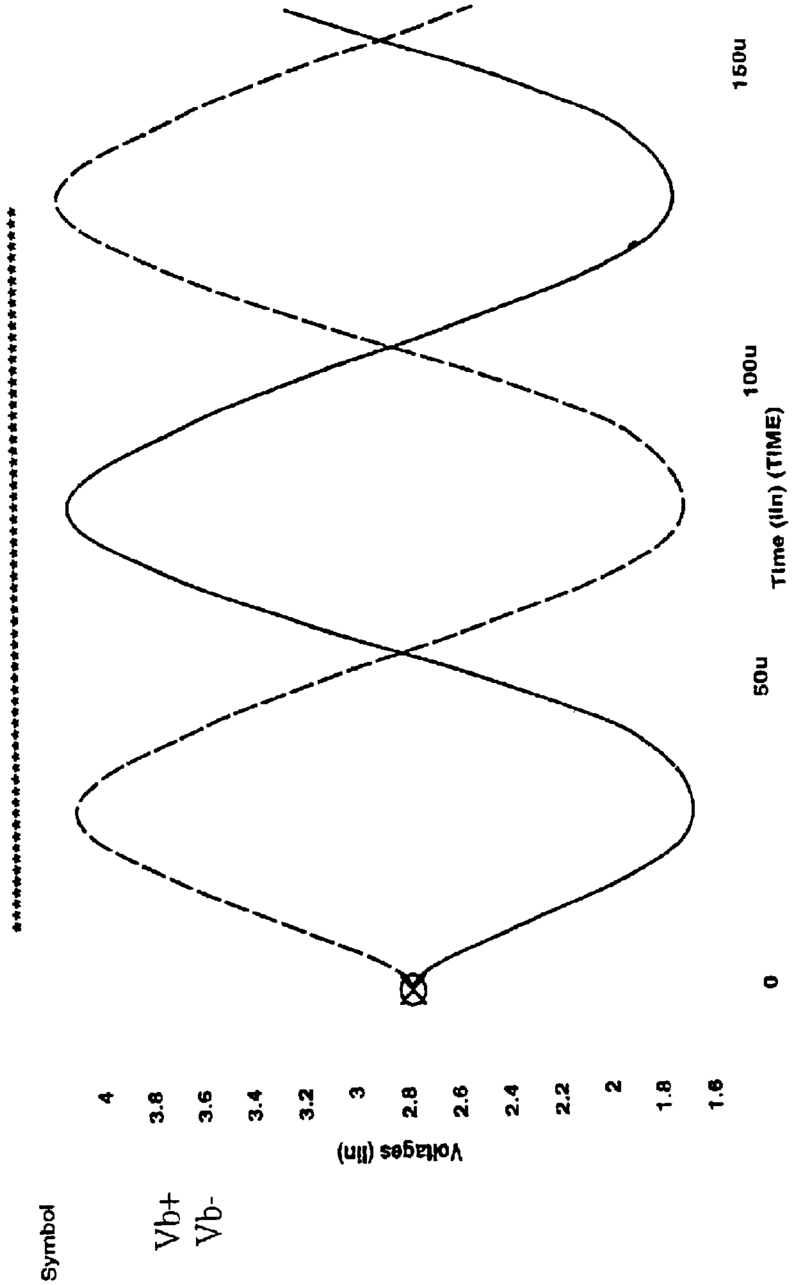
FIG. 3 is a plan schematic view similar to FIG. 2, illustrating the waveforms of the common mode feedback amplifier having the gain amplifiers included therein.

However, the CMFB 11 has a working limit, and the DC voltage of the output signals Va+ and Va− of the common mode feedback amplifier unit 1 may normally be deflected from the reference signal Vref to either higher or lower voltage. The output signals Va+ and Va− may thus be distorted. If the DC voltage of the differential signals has higher voltage then the differential signals are squeezed when the signals are high and extended when the signals are low because the space between the DC voltage and power source Vcc is smaller and the space between the DC voltage and the ground is larger. On the other hand if the DC voltage of the differential signals has lower voltage then the differential signals are squeezed when the signals are lower and extended when the signals are high for the same reason as described above. The deflection or distortion may be greatly increased particularly when the input signals are large. The waveforms of the output signals Va+ and Va− of the common mode feedback amplifier unit 1 are shown in FIG. 2.

The gain amplifiers 21, 22 of the differential adjusting unit 2 are coupled to the output terminals 13, 14 of the differential amplifier 12, to amplify and combine the output signals Va+ and Va− of the common mode feedback amplifier unit 1. The gain amplifiers 21, 22 of the differential adjusting unit 2 may prevent the output signals Vb+ and Vb− from being distorted.

The relationship between the output signals Vb+ and Vb− and Va+ and Va− is as follows:

$$Vb+=Va++(Va+-Va-)\times(Rf/R)\text{, in which}$$

$$Va+=-Va-\text{, such that } Vb+=(R+2Rf)/R\times Va+;$$

$$\text{Similarly, } Vb-=-(R+2Rf)/R\times Va+;$$

The differential gain Avdiff of the gain amplifiers 21, 22 may thus become:

$$\begin{aligned} Avdiff &= (Vb+-Vb-)/(Va+-Va-) \\ &= (R+2Rf)/R;\text{ or } 1+2Rf/R. \end{aligned}$$

Under the common mode: Vb−=Va−; and Vb+=Va+; and thus

Vb+=Vb−=Va+=Va−, such that the common gain Avcom of the gain amplifiers 21, 22 may thus become:

$$Avcom=(Vb+-Vb-)/(Va+-Va-)=1.$$

As a result, $$Avdiff/Avcom=1+2Rf/R.$$

Accordingly, the common gain Avcom of the gain amplifiers 21, 22 equals to one (1), and the differential gain Avdiff of the gain amplifiers 21, 22 may be greater than one (1). This indicates that the DC voltage of the output signals Vb+ and Vb− of the gain amplifier devices 21, 22 of the differential adjusting unit 2 may thus be maintained at the same level while the distortion of the output signals Vb+ and Vb− is improved by a factor of 1+2Rf/R.

The gain amplifiers 21, 22 of the differential adjusting unit 2 may thus be used as a means or device to combine the output signals Va+ and Va− of the common mode feedback amplifier unit 1, and to output and maintain the DC voltage of output signals Vb+ and Vb− of the gain amplifier devices 21, 22 at the reference signal Vref, and may reduce the distortion level of the output signals Vb+ and Vb− due to the nature of symmetric distortion of the differential signals from CMFB amplifiers and the voltage gain of the differential adjusting amplifiers as described before.

Accordingly, the common mode feedback circuit in accordance with the present invention includes an improving circuit or structure to maintain the output signals at the reference signal, and to prevent the output signals from being distorted.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A common mode feedback circuit comprising:

a common mode feedback amplifier unit including output signals and a reference signal, and a differential adjusting unit for calibrating and adjusting the output signals of said common mode feedback amplifier unit, to prevent the DC voltage of the output signals of said common mode feedback amplifier with differential adjusting unit from being deviated, and to prevent the output signals of said common mode feedback amplifier with differential adjusting unit from being distorted, said differential adjusting unit including two sets of gain amplifiers having identical structure, and the two differential input signals of a first gain amplifier of said gain amplifiers are identical to the two differential input signals of a second gain amplifier of said gain amplifiers, but coupled in reverse relative to the two differential input signals of said second gain amplifier.

2. The common mode feedback circuit as claimed in claim 1, wherein said differential adjusting unit includes signals from the output terminals of said common mode feedback amplifier unit.

3. The common mode feedback circuits as claimed in claim 1, wherein said gain amplifiers include two input signals as differential signals relative to each other.

4. The common mode feedback device as claimed in claim 1, wherein said two sets of gain amplifiers output two differential signals that are complementary with each other.

* * * * *